United States Patent
Wang

(10) Patent No.: US 11,973,151 B2
(45) Date of Patent: Apr. 30, 2024

(54) HJT CELL HAVING HIGH PHOTOELECTRIC CONVERSION EFFICIENCY AND PREPARATION METHOD THEREFOR

(71) Applicants: Tongwei Solar (Chengdu) Co., Ltd., Sichuan (CN); Tongwei Solar (Meishan) Co., Ltd., Sichuan (CN); Tongwei Solar (Jintang) Co., Ltd., Sichuan (CN); Tongwei Solar (Hefei) Co., Ltd., Anhui (CN); Tongwei Solar (Anhui) Co., Ltd., Anhui (CN)

(72) Inventor: Jinle Wang, Sichuan (CN)

(73) Assignees: TONGWEI SOLAR (CHENGDU) CO., LTD., Sichuan (CN); TONGWEI SOLAR (MEISHAN) CO., LTD., Sichuan (CN); TONGWEI SOLAR (JINTANG) CO., LTD., Sichuan (CN); TONGWEI SOLAR (HEFEI) CO., LTD., Anhui (CN); TONGWEI SOLAR (ANHUI) CO., LTD., Anhui (CN)

( * ) Notice: Subject to any disclaimer, the term of this patent is extended or adjusted under 35 U.S.C. 154(b) by 0 days.

(21) Appl. No.: 17/928,435

(22) PCT Filed: Dec. 28, 2021

(86) PCT No.: PCT/CN2021/141997
§ 371 (c)(1),
(2) Date: Nov. 29, 2022

(87) PCT Pub. No.: WO2022/170872
PCT Pub. Date: Aug. 18, 2022

(65) Prior Publication Data
US 2023/0178664 A1    Jun. 8, 2023

(30) Foreign Application Priority Data

Feb. 9, 2021    (CN) .......................... 202110177396.7

(51) Int. Cl.
*H01L 31/0216*    (2014.01)
*H01L 31/0224*    (2006.01)
(Continued)

(52) U.S. Cl.
CPC .................. *H01L 31/02167* (2013.01); *H01L 31/022425* (2013.01); *H01L 31/0747* (2013.01); *H01L 31/202* (2013.01); *H01L 31/208* (2013.01)

(58) Field of Classification Search
CPC ....... H01L 31/02167; H01L 31/022425; H01L 31/0747; H01L 31/202; H01L 31/208
See application file for complete search history.

(56) References Cited

U.S. PATENT DOCUMENTS

2007/0256728 A1* 11/2007 Cousins ................ H01L 31/068
136/252
2012/0055547 A1    3/2012 Schultz-Wittmann et al.
(Continued)

FOREIGN PATENT DOCUMENTS

CN    106252424    12/2016
CN    205920977 U    2/2017
(Continued)

OTHER PUBLICATIONS

PCT International Search Report (w/ English translation) and Written Opinion for corresponding PCT Application No. PCT/CN2021/141997, dated Apr. 7, 2022, 10 pages.
(Continued)

*Primary Examiner* — Golam Mowla
(74) *Attorney, Agent, or Firm* — Dority & Manning, P.A.

(57) ABSTRACT

Provided are a HJT cell having high photoelectric conversion efficiency and a method for preparing the same. The
(Continued)

HJT cell includes an N-type crystalline silicon wafer. An intrinsic amorphous silicon layer, a $SiO_2$ layer, a C-doped $SiO_2$ layer, a doped N-type amorphous silicon layer, a TCO conductive layer and an electrode are sequentially disposed on a front surface of the N-type crystalline silicon wafer. An intrinsic amorphous silicon layer, a $SiO_2$ layer, a C-doped $SiO_2$ layer, a doped P-type amorphous silicon layer, a TCO conductive layer and an electrode are sequentially disposed on a back surface of the N-type crystalline silicon wafer. The doped P-type amorphous silicon layer includes a lightly B-doped amorphous silicon layer and a heavily B-doped amorphous silicon layer.

17 Claims, 1 Drawing Sheet

(51) Int. Cl.
*H01L 31/0747* (2012.01)
*H01L 31/20* (2006.01)

(56) References Cited

U.S. PATENT DOCUMENTS

| | | | | |
|---|---|---|---|---|
| 2012/0222731 | A1* | 9/2012 | Hsieh | H01L 31/078 136/255 |
| 2013/0014811 | A1 | 1/2013 | Bedell et al. | |
| 2013/0025658 | A1* | 1/2013 | Bedell | H01L 31/1808 136/255 |
| 2017/0179320 | A1* | 6/2017 | Erben | H01L 31/202 |
| 2017/0194516 | A1* | 7/2017 | Reddy | H01L 31/0747 |
| 2017/0207354 | A1* | 7/2017 | Lee | H01L 31/02366 |
| 2017/0022274 | A1 | 8/2017 | Yamada et al. | |
| 2017/0256661 | A1* | 9/2017 | Xu | H01L 31/0504 |
| 2019/0006534 | A1 | 1/2019 | Fujita et al. | |
| 2020/0295215 | A1* | 9/2020 | Schueppen | H01L 31/0725 |

FOREIGN PATENT DOCUMENTS

| | | | | |
|---|---|---|---|---|
| CN | 208256688 | U * | 12/2018 | Y02P 70/50 |
| CN | 109119491 | A | 1/2019 | |
| CN | 109509807 | | 3/2019 | |
| CN | 111509058 | | 8/2020 | |
| CN | 111653644 | | 9/2020 | |
| CN | 211654834 | U | 10/2020 | |
| CN | 112151636 | A | 12/2020 | |
| CN | 112768549 | | 5/2021 | |
| CN | 113629155 | A * | 11/2021 | H01L 31/0682 |
| CN | 215220744 | | 12/2021 | |
| KR | 101867969 | B1 * | 6/2018 | H01L 31/0392 |

OTHER PUBLICATIONS

Australian Office Action for corresponding Application No. 2021426902, dated Sep. 18, 2023, 5 pages.
Extended European Search Report for corresponding Application No. 21925517, dated Nov. 14, 2023, 5 pages.

* cited by examiner

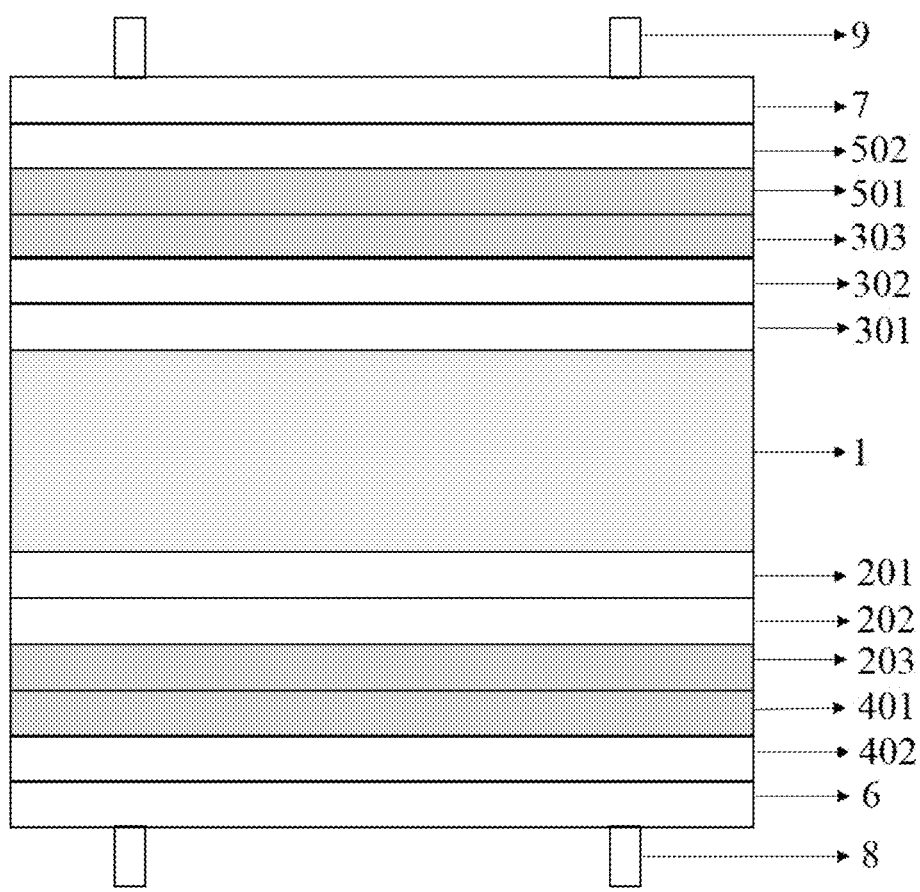

HJT CELL HAVING HIGH PHOTOELECTRIC CONVERSION EFFICIENCY AND PREPARATION METHOD THEREFOR

CROSS REFERENCE TO RELATED APPLICATIONS

This application is a US national stage application of PCT international application PCT/CN2021/141997, filed on Dec. 28, 2021, which claims priority to Chinese patent application No. 2021101773967 filed with the Chinese Patent Office on Feb. 9, 2021, entitled "HJT CELL HAVING HIGH PHOTOELECTRIC CONVERSION EFFICIENCY AND PREPARATION METHOD THEREFOR", both of which are incorporated by reference herein in their entireties.

TECHNICAL FIELD

The present application relates to the technical field of solar cells, and more particularly, to a HJT cell having high photoelectric conversion efficiency and a preparation method therefor.

BACKGROUND

Nowadays P-type monocrystalline passivated emitter and rear cells (PERCs) are the mainstream cells in the market, and the efficiency of P-type PERC cells has reached the upper limit. However, with the demand of the market and the continuous development of technology in the industry, N-type crystalline silicon solar cell technology has received more and more attention in recent years, which mainly includes passivated emitter and rear totally-diffused (n-PERT) cells, tunnel oxide passivation contact (TOPCon) cells and heterojunction (HJT) cells. N-type crystalline silicon solar cells make further breakthroughs in the conversion efficiency of crystalline silicon solar cells.

HJT cells use low-cost amorphous silicon as an emission layer, and an emission layer is made of doped amorphous silicon material. When performing deposition process on the monocrystalline silicon, only about 200° C. will meet the temperature requirements, and the low temperature process ensures less interface damage to the monocrystalline silicon substrate. Meanwhile, the existence of an intrinsic layer gives rise to a better interface passivation performance. Heterojunction solar cells maintain the core advantage of high efficiency due to a large forbidden band width of the heterostructure. However, there are still some technical difficulties to be overcome, such as the passivation characteristics of the amorphous silicon layer and the transport characteristics of carriers in the structural layers, which all affect the photoelectric conversion efficiency of the HJT cells. Therefore, how to figure out a method of preparing a heterojunction cell that improves conversion rate of light is an urgent problem confronted by those skilled in the art.

SUMMARY

In order to achieve the above purposes, the technical solution provided by this application is as follows.

A HJT cell having high photoelectric conversion efficiency according to the present application includes an N-type crystalline silicon wafer. An intrinsic amorphous silicon layer, a $SiO_2$ layer, a C-doped $SiO_2$ layer, a doped N-type amorphous silicon layer, a TCO conductive layer and electrodes are sequentially disposed on a front surface of the N-type crystalline silicon wafer, and an intrinsic amorphous silicon layer, a $SiO_2$ layer, a C-doped $SiO_2$ layer, a doped P-type amorphous silicon layer, a TCO conductive layer and electrodes are sequentially disposed on a back surface of the N-type crystalline silicon wafer.

Further, the intrinsic amorphous silicon layer includes a hydrogenated intrinsic amorphous silicon film layer.

Further, a thickness of the intrinsic amorphous silicon layer or the hydrogenated intrinsic amorphous silicon film layer ranges from 3 nm to 10 nm.

Further, a thickness of the $SiO_2$ layer and a thickness of the C-doped $SiO_2$ layer each range from 1 nm to 5 nm.

Further, a thickness of the doped P-type amorphous silicon layer from 10 nm to 30 nm, the doped P-type amorphous silicon layer includes a lightly B-doped amorphous silicon layer and a heavily B-doped amorphous silicon layer, the lightly B-doped amorphous silicon layer is located closer to the C-doped $SiO_2$ layer, and the heavily B-doped amorphous silicon layer is located closer to the TCO conductive layer.

Further, the lightly B-doped amorphous silicon layer is formed by doping with TMB gas, a thickness of the lightly B-doped amorphous silicon layer ranges from 1 nm to 20 nm, and a forbidden band width of the lightly B-doped amorphous silicon layer ranges from 1.7 eV to 1.8 eV.

Further, the heavily B-doped amorphous silicon layer is formed by doping with $B_2H_6$ gas, a thickness of the heavily B-doped amorphous silicon layer ranges from 1 nm to 20 nm, and a forbidden band width of the heavily B-doped amorphous silicon layer ranges from 1.4 eV to 1.6 eV.

Further, a thickness of the doped N-type amorphous silicon layer ranges from 10 nm to 30 nm, the doped N-type amorphous silicon layer includes a lightly P-doped amorphous silicon layer and a heavily P-doped amorphous silicon layer, the lightly P-doped amorphous silicon layer is located closer to the C-doped $SiO_2$ layer, the heavily P-doped amorphous silicon layer is located closer to the TCO conductive layer, a thickness of the lightly P-doped amorphous silicon layer ranges from 1 nm to 20 nm, and a thickness of the heavily P-doped amorphous silicon layer ranges from 1 nm to 20 nm. The heavily P-doped amorphous silicon layer can be formed by plasma chemical vapor deposition or formed by coating the lightly P-doped amorphous silicon layer with a liquid phosphorus source and then curing by laser heating.

A method for preparing a HJT cell having high photoelectric conversion efficiency according to the present application includes:

texturing and cleaning a N-type crystalline silicon wafer;
  forming an intrinsic amorphous silicon layer or a hydrogenated intrinsic amorphous silicon film layer on both sides of the N-type crystalline silicon wafer by plasma enhanced chemical vapor deposition;
  forming a $SiO_2$ layer and a C-doped $SiO_2$ layer by plasma enhanced chemical vapor deposition;
  forming a doped N-type amorphous silicon layer and a doped P-type amorphous silicon layer by plasma enhanced chemical vapor deposition; the doped N-type amorphous silicon layer includes a lightly P-doped amorphous silicon layer (i.e., an N-type amorphous silicon layer lightly doped with P atoms) and a heavily P-doped amorphous silicon layer (i.e., an N-type amorphous silicon layer heavily doped with P atoms); the doped P-type amorphous silicon layer includes a lightly B-doped P-type amorphous silicon layer formed by doping with TMB gas and a heavily B-doped P-type amorphous silicon layer formed by doping with $B_2H_6$ gas;

depositing a TCO conductive layer by deposition or sputtering by reactive ions; and forming front and back Ag electrodes by screen printing, curing the front and back Ag electrodes to form good ohmic contact with the TCO conductive film.

Further, the forming the doped N-type amorphous silicon layer and the doped P-type amorphous silicon layer by plasma enhanced chemical vapor deposition includes growing, at a temperature of a silicon wafer substrate of 100° C.-300° C. and under a deposition pressure of 10 Pa-300 Pa, the doped N-type amorphous silicon layer and the doped P-type amorphous silicon layer respectively by using $H_2$, $SiH_4$, and doping gases TMB, $B_2H_6$ and $PH_3$ as reaction gases when a base vacuum of a vacuum chamber reaches $5 \times 10^{-4}$ Pa.

Further, the forming the doped N-type amorphous silicon layer and the doped P-type amorphous silicon layer by plasma enhanced chemical vapor deposition includes growing, at a temperature of a silicon wafer substrate of 100° C.-300° C. and under a deposition pressure of 10 Pa-300 Pa, the doped N-type amorphous silicon layer and the doped P-type amorphous silicon layer on back surfaces of hydrogenated amorphous silicon oxycarbide films respectively by using $H_2$, $SiH_4$, and doping gases TMB, $B_2H_6$ and $PH_3$ as reaction gases when a base vacuum of a vacuum chamber reaches $5 \times 10^{-4}$ Pa.

Further, the depositing the TCO conductive layer by deposition or sputtering by reactive ions includes depositing a transparent conductive ITO film on a front surface and a back surface respectively by magnetron sputtering. The ITO film has a thickness of 70 nm to 110 nm, a transmittance of 98% or more, and a sheet resistance of 50Ω/ to 100Ω/.

Further, the forming the front and back electrodes by screen printing includes further printing a layer of low-temperature conductive silver paste on the front and back TCO conductive layers by screen printing, respectively, and then sintering the layers of low-temperature conductive silver paste at a low temperature of 150° C. to 300° C. to form good ohmic contact. An Ag grid line has a thickness of 5 μm to 50 μm, a width of 20 μm to 60 μm, and a pitch of 1 mm to 5 mm.

Compared to the existing known technologies, the technical solutions provided in the present application has the following significant effects.

(1) In the HJT cell having high photoelectric conversion efficiency of the present application, broken bonds on a surface of the amorphous silicon layer that is disposed on a surface of a silicon substrate is passivated by the $SiO_2$ layer, and the C-doped $SiO_2$ layer accommodates and blocks the doping atoms from the lightly doped p-typed and n-typed amorphous silicon layers to avoid diffusion of the doping atoms into the amorphous silicon layer.

(2) In the HJT cell with high photoelectric conversion efficiency of the present application, the heavily doped p-type and n-type amorphous silicon layers form good electric contact with the TCO layers respectively. The doped p-type amorphous silicon layer on the back surface adopts a double-layer stacked structure, and the doped p-type layer closer to the C-doped $SiO_2$ layer is doped with TMB gas, which prevents the doping atoms B (boron) from diffusing into the amorphous silicon intrinsic layer, thus ensuring passivation effect of the substrate silicon by the intrinsic amorphous silicon or the hydrogenated intrinsic amorphous silicon, and increasing the open-circuit voltage Voc. The doped p-type layer closer to the intrinsic amorphous silicon layer is doped with TMB gas, which has a larger forbidden band Width than the doped amorphous silicon layer doped with $B_2H_6$ gas, and the doped atoms are thermally stable, so that the incident light can pass through the doped layer more effectively, thereby enhancing the absorption of light by crystalline silicon and increasing the short-circuit current Isc. The doped p-type layer closer to the TCO layer side is heavily doped with $B_2H_6$ gas, so that the doped layer has better electrical conductivity and the series resistance Rs of the solar cells is lower, which results in a higher fill factor FF, and consequently improves the photoelectric conversion efficiency of the HJT solar cell.

BRIEF DESCRIPTION OF THE DRAWINGS

FIG. 1 is a schematic structural diagram of a HJT cell having high photoelectric conversion efficiency according to the present application.

1. N-type crystalline silicon wafer; 201 (301), intrinsic amorphous silicon layer; 202 (302), $SiO_2$ layer; 203 (303), C-doped $SiO_2$ layer; 401, lightly B-doped amorphous silicon layer; 402 501, lightly P-doped amorphous silicon layer; 502, heavily P-doped amorphous silicon layer; 6 (7), TCO conductive layer; 8 (9), electrode.

DETAILED DESCRIPTION

For understanding the content of the present application, the present application will be described in detail with reference to the accompanying drawings and embodiments.

In the structure of an existing HJT cell, an amorphous silicon intrinsic layer and a doped layer are formed on both sides of an N-type monocrystalline silicon. The amorphous silicon intrinsic layer is mainly to passivate the surface defects of the crystalline silicon, reduce surface-defect states, and thus reduce carrier recombination. The doped amorphous silicon layer mainly forms a PIN junction with crystalline silicon and a field effect passivation layer. However, in the existing art, a doped P-type amorphous silicon layer is formed by doping with $B_2H_6$ gas, which has poor thermal stability. B atoms are easily diffused into the amorphous silicon intrinsic layer, affecting the passivation effect of the intrinsic layer and leading to a low open-circuit voltage of the solar cells, which in turn leads to a low conversion efficiency of the solar cells. In addition, the doped P-type amorphous silicon layer formed by doping with $B_2H_6$ gas has a low forbidden band width, which absorbs more sunlight, resulting in more light loss in the long wavelength band, leading to a low short-circuit current of solar cells and a low overall conversion efficiency of solar cells.

Chinese patent No. ZL 201811472120.6, entitled "Emitter structure of crystalline silicon heterojunction solar cell and method of making the same" has been found by search. The application discloses an N-type crystalline silicon wafer with an amorphous silicon intrinsic layer on both the front and back surfaces of the N-type crystalline silicon wafer. A transparent conductive oxide (TCO) conductive film is disposed on an outer surface of each amorphous silicon intrinsic layer. A number of Ag electrodes are provided on an outer surface of the TCO conductive film. A doped N-type amorphous silicon layer is provided between the amorphous silicon intrinsic layer and the TCO conductive film on one side of the N-type crystalline silicon wafer, and a trimethyl boron (TMB) doped layer and a $B_2H_6$ doped layer are provided between the amorphous silicon intrinsic layer and the TCO conductive film on the other side of the N-type crystalline silicon wafer. The application uses TMB gas for doping to prevent the doping atoms B from diffusing to the amorphous silicon intrinsic layer and improve the open-circuit voltage. The TMB gas has a large forbidden band width, so that light can pass through the doped layer more effectively, increasing the short-circuit current. The $B_2H_6$ gas is used for doping at the TCO side, so that the conductivity of the doped layer is better, which improves the photoelectric conversion efficiency of HJT solar cells. Although a lightly B-doped layer is provided near the amorphous silicon intrinsic layer in the application, some B atoms may diffuse to the amorphous silicon intrinsic layer, affecting the film quality of the amorphous silicon intrinsic layer, and reducing the open circuit voltage to some extent.

To overcome the shortcomings of the above existing art, the present application provides a HJT cell having high photoelectric conversion efficiency and a preparation method for making the same. In some embodiments, the present application takes a hydrogenated amorphous silicon oxide film as an intrinsic passivation layer and double-diffusion B-doped P-type layer to make a heterojunction solar cell, which has an increased photoelectric conversion efficiency of 24.3% or more. The short-circuit current and the open circuit voltage are significantly improved, and the photoelectric conversion efficiency of the silicon heterojunction solar cell can be effectively improved.

In an embodiment, referring to FIG. 1, a HJT cell having high photoelectric conversion efficiency according to this embodiment includes an N-type crystalline silicon wafer 1. An intrinsic amorphous silicon layer 301, a $SiO_2$ layer 302, a C-doped $SiO_2$ layer 303, a doped N-type amorphous silicon layer, a TCO conductive layer 7 and electrodes 9 are sequentially disposed on a front surface of the N-type crystalline silicon wafer 1. An intrinsic amorphous silicon layer 201, a $SiO_2$ layer 202, a C-doped $SiO_2$ layer 203, a doped P-type amorphous silicon layer, a TCO conductive layer 6 and electrodes 8 are sequentially disposed on a back surface of the N-type crystalline silicon wafer 1.

The intrinsic amorphous silicon layer has a thickness of 3 nm.

The $SiO_2$ layer and C-doped $SiO_2$ layer each has a thickness of 1 nm.

The doped P-type amorphous silicon layer has a thickness of 10 nm, and the doped N-type amorphous silicon layer has a thickness of 10 nm. The TCO conductive layer has a thickness of 70 nm.

In this embodiment, broken bonds on a surface of the amorphous silicon layer that is disposed on a surface of a silicon substrate is passivated by the $SiO_2$ layer, and the C-doped $SiO_2$ layer accommodates and blocks the doping atoms from the p-typed and n-typed lightly doped amorphous silicon layers to avoid diffusion of the doping atoms into the amorphous silicon layer.

In an embodiment, in the HJT cell having high photoelectric conversion efficiency, the thickness of the intrinsic amorphous silicon layer is 10 nm. The thicknesses of the $SiO_2$ layer and the C-doped $SiO_2$ layer are both 5 nm. The thickness of the doped P-type amorphous silicon layer is 30 nm, and the thickness of the doped N-type amorphous silicon layer is 30 nm. The thickness of the TCO conductive layer is 110 nm.

In an embodiment, in the HJT cell having high photoelectric conversion efficiency, the thickness of the intrinsic amorphous silicon layer is 5 nm. The thickness of the $SiO_2$ layer is 3 nm, and the thickness of the C-doped $SiO_2$ layer is 4 nm. The thickness of the doped P-type amorphous silicon layer is 20 nm, and the thickness of the doped N-type amorphous silicon layer is 25 nm. The thickness of the TCO conductive layer is 100 nm.

In an embodiment, referring to FIG. 1, the HJT cell having high photoelectric conversion efficiency in this embodiment includes an N-type crystalline silicon wafer 1. A hydrogenated intrinsic amorphous silicon film layer 301, a $SiO_2$ layer 302, a C-doped $SiO_2$ layer 303, a doped N-type amorphous silicon layer, a TCO conductive layer 7 and electrodes 9 are sequentially disposed on a front surface of the N-type crystalline silicon wafer 1. A hydrogenated intrinsic amorphous silicon film layer 201, a $SiO_2$ layer 202, a C-doped $SiO_2$ layer 203, a doped P-type amorphous silicon layer, a TCO conductive layer 6 and electrodes 8 are sequentially disposed on a back surface of the N-type crystalline silicon wafer 1.

A thickness of the hydrogenated intrinsic amorphous silicon film layer (i-a-Si:H) is 3 nm.

Thicknesses of the $SiO_2$ layer and the C-doped $SiO_2$ layer are both 1 nm. The C-doped $SiO_2$ layer that is formed by using a homotope to dope the $SiO_2$ layer accommodates a small amount of lightly doping B or P atoms, so as to avoid unnecessary doping of the hydrogenated intrinsic amorphous silicon film layer (i-a-Si:H) which otherwise affects passivation quality.

A thickness of the doped P-type amorphous silicon layer is 20 nm. The doped P-type amorphous silicon layer includes a lightly B-doped amorphous silicon layer 401 and a heavily B-doped amorphous silicon layer 402. The lightly B-doped amorphous silicon layer 401 is closer to the C-doped $SiO_2$ layer 203, and the heavily B-doped amorphous silicon layer 402 is closer to the TCO conductive layer 6. By changing the doping source and doping concentration, the forbidden band width of the doped layer can be adjusted, a doped layer with high thermal stability and a large forbidden band width can be formed on the light-receiving surface, allowing more incident light to passes through the doped layer on the light-receiving surface, and consequently, more light waves can be effectively absorbed to generate photon-generated carriers. Specifically, in this embodiment, the lightly B-doped amorphous silicon layer 401 is formed by doping with TMB gas, and has a thickness of 1 nm and a forbidden band width of 1.8 eV. The heavily B-doped amorphous silicon layer 402 is formed by doping with $B_2H_6$ gas, and has a thickness of 19 nm and a forbidden band width of 1.6 eV.

The thickness of the doped N-type amorphous silicon layer is 20 nm. The doped N-type amorphous silicon layer includes a lightly P-doped amorphous silicon layer 501 and a heavily P-doped amorphous silicon layer 502. The lightly P-doped amorphous silicon layer 501 is closer to the C-doped $SiO_2$ layer 303, and the heavily P-doped amorphous silicon layer 502 is closer to the TCO conductive layer 7. The lightly P-doped amorphous silicon layer 501 has a thickness of 1 nm, and the heavily P-doped amorphous silicon layer 502 has a thickness of 19 nm.

A thickness of the TCO conductive layer is 70 nm.

In this embodiment, the heavily doped P-type and N-type amorphous silicon layers form good electrical contact with the TCO layers respectively. The doped P-type amorphous silicon layer on the back surface has a double-layer structure. The doped P-type layer closer to the C-doped $SiO_2$ is doped with TMB gas, which prevents doping atoms B (boron) from diffusing to the intrinsic amorphous silicon layer, thereby ensuring passivation effect of the silicon substrate by the intrinsic amorphous silicon or the hydrogenated intrinsic amorphous silicon, and increasing the open circuit voltage Voc. The doped P-type layer closer to the intrinsic amorphous silicon layer is doped with TMB gas, which has a larger forbidden band width than that of a doped amorphous silicon layer doped with $B_2H_6$ gas, and the doping atoms are thermally stable, so that the incident light can pass through the doped layer more effectively, thus enhancing the absorption of light by crystalline silicon and increasing the short-circuit current Isc. The doped P-type layer closer to the TCO layer side is heavily doped with $B_2H_6$ gas, so that the doped layer has better conductivity and a series resistance Rs of solar cells is lower, which results in a higher filling factor FF and consequently an enhanced photoelectric conversion efficiency of the HJT solar cell.

The method for preparing the HJT cell having high photoelectric conversion efficiency of this embodiment includes following steps.

At step 1, an N-type crystalline silicon wafer 1 is textured and cleaned.

At step 2, hydrogenated intrinsic amorphous silicon film layers are formed on both sides of the N-type crystalline silicon wafer 1 by plasma enhanced chemical vapor deposition (PECVD).

At step 3, $SiO_2$ layers and C-doped $SiO_2$ layers are formed by plasma enhanced chemical vapor deposition.

At step 4, a doped N-type amorphous silicon layer and a doped P-type amorphous silicon layer are formed by plasma enhanced chemical vapor deposition. The doped N-type amorphous silicon layer includes a lightly P-doped amorphous silicon layer (i.e., an N-type amorphous silicon layer lightly doped with P atoms) and a heavily P-doped amorphous silicon layer (i.e., an N-type amorphous silicon layer heavily doped with P atoms). The doped P-type amorphous silicon layer includes a lightly B-doped P-type amorphous silicon layer formed by doping with TMB gas and a heavily B-doped P-type amorphous silicon layer formed by doping with $B_2H_6$ gas.

The deposition of the doped layers includes growing, at a temperature of a silicon wafer substrate of 100° C. and under a deposition pressure of 10 Pa, the doped N-type amorphous silicon layer and the doped P-type amorphous silicon layer on back surfaces of hydrogenated amorphous silicon oxycarbide films respectively, by using $H_2$, $SiH_4$, and doping gases TMB, $B_2H_6$ and $PH_3$ as reaction gases when a base vacuum of a vacuum chamber reaches $5\times10^{-4}$ Pa.

At step 5, a transparent conductive ITO film is deposited on the front and back surfaces respectively by magnetron sputtering. The ITO film has a transmittance of 98% or more and a sheet resistance of $50\Omega/\square$.

At step 6, a layer of low-temperature conductive silver paste is printed on the TCO conductive layers of the front and back surfaces respectively by screen printing, and then the layers of low-temperature conductive silver paste are sintered at a low temperature of 150° C. to form good ohmic contact. An Ag grid line has a thickness of 5 μm, a width of 20 μm, and a pitch of 1 mm.

The heterojunction solar cell according to this embodiment is made by including hydrogenated amorphous silicon oxide films as the intrinsic passivation layers and including a double-diffusion B-doped P-type layer, the photoelectric conversion efficiency can be increased to 24.3% or more, the short-circuit current and the open-circuit voltage can be increased significantly, and thus the photoelectric conversion efficiency can be improved effectively.

In an embodiment, in the HJT cell having high photoelectric conversion efficiency, the thickness of the hydrogenated intrinsic amorphous silicon film layer (i-a-Si:H) is 10 nm. The $SiO_2$ layer and C-doped $SiO_2$ layer each has a thickness of 5 nm.

The doped P-type amorphous silicon layer has a thickness of 10 nm. The lightly B-doped amorphous silicon layer 401 has a thickness of 8 nm and a forbidden band width of 1.7 eV, and the heavily B-doped amorphous silicon layer 402 has a thickness of 2 nm and a forbidden band width of 1.4 eV.

The doped N-type amorphous silicon layer has a thickness of 10 nm. The lightly P-doped amorphous silicon layer 501 has a thickness of 8 nm, and the heavily P-doped amorphous silicon layer 502 has a thickness of 2 nm.

The method for preparing the HJT cell having high photoelectric conversion efficiency of this embodiment includes following steps.

At step 1, an N-type crystalline silicon wafer 1 is textured and cleaned.

At step 2, hydrogenated intrinsic amorphous silicon film layers are formed on both sides of the N-type crystalline silicon wafer 1 by plasma enhanced chemical vapor deposition (PECVD).

At step 3, $SiO_2$ layers and C-doped $SiO_2$ layers are formed by plasma enhanced chemical vapor deposition.

At step 4, a doped N-type amorphous silicon layer and a doped P-type amorphous silicon layer are formed by plasma enhanced chemical vapor deposition. The deposition of the doped layers includes growing, at a temperature of a silicon wafer substrate of 150° C. and under a deposition pressure of 50 Pa, the doped N-type amorphous silicon layer and the doped P-type amorphous silicon layer on back surfaces of hydrogenated amorphous silicon oxycarbide films respectively, by using $H_2$, $SiH_4$, and doping gases TMB, $B_2H_6$ and $PH_3$ as reaction gases when a base vacuum of a vacuum chamber reaches $5\times10^{-4}$ Pa.

At step 5, a transparent conductive ITO film is deposited on the front and back surfaces respectively by magnetron sputtering. The film has a thickness of 80 nm, a transmittance of 98% or more, and a sheet resistance of $50\Omega/\square$.

At step 6, a layer of low-temperature conductive silver paste is printed on the TCO conductive layers of the front and back surfaces respectively by screen printing, and then the layers of low-temperature conductive silver paste are sintered at a low temperature of 150° C. to form good ohmic contact. An Ag grid line has a thickness of 15 μm, a width of 30 μm, and a pitch of 3 mm.

In an embodiment, in the HJT cell having high photoelectric conversion efficiency, the hydrogenated intrinsic amorphous silicon film layer (i-a-Si:H) has a thickness of 6 nm. The $SiO_2$ layer and C-doped $SiO_2$ layer each has a thickness of 3 nm.

The doped P-type amorphous silicon layer has a thickness of 30 nm. The lightly B-doped amorphous silicon layer 401 has a thickness of 18 nm and a forbidden band width of 1.75 eV. The heavily B-doped amorphous silicon layer 402 has a thickness of 12 nm and a forbidden band width of 1.5 eV.

The doped N-type amorphous silicon layer has a thickness of 30 nm. The lightly P-doped amorphous silicon layer 501 has a thickness of 18 nm, and the heavily P-doped amorphous silicon layer 502 has a thickness of 12 nm.

The method for preparing the HJT cell having high photoelectric conversion efficiency of this embodiment includes following steps.

At step 1, an N-type crystalline silicon wafer 1 is textured and cleaned.

At step 2, hydrogenated intrinsic amorphous silicon film layers are formed on both sides of the N-type crystalline silicon wafer 1 by plasma enhanced chemical vapor deposition.

At step 3, $SiO_2$ layers and C-doped $SiO_2$ layers are formed by plasma enhanced chemical vapor deposition (PECVD).

At step 4, a doped N-type amorphous silicon layer and a doped P-type amorphous silicon layer are formed by plasma enhanced chemical vapor deposition. The deposition of the doped layers includes growing, at a temperature of a silicon wafer substrate of 300° C. and under a deposition pressure of 300 Pa, the doped N-type amorphous silicon layer and the doped P-type amorphous silicon layer on back surfaces of hydrogenated amorphous silicon oxycarbide films respectively, by using $H_2$, $SiH_4$, and doping gases TMB, $B_2H_6$ and $PH_3$ as reaction gases when a base vacuum of a vacuum chamber reaches $5 \times 10^{-4}$ Pa.

At step 5, a transparent conductive ITO film is deposited on the front and back surfaces respectively by magnetron sputtering. The film has a thickness of 110 nm, a transmittance of 98% or more, and a sheet resistance of $100\Omega/\square$.

At step 6, a layer of low-temperature conductive silver paste is printed on the TCO conductive layers of the front and back surfaces respectively by screen printing, and then the layers of low-temperature conductive silver paste are sintered at a low temperature of 190° C. to form good ohmic contact. An Ag grid line has a thickness of 50 μm, a width of 60 μm, and a pitch of 5 mm.

The present application and its embodiments have been described exemplarily, and the description is not limitative. Also, what are shown in the drawings illustrate only some of the embodiments of the present application, and actual structures are not limited to it. Therefore, any structure and embodiment similar to the technical solution designed by a person of ordinary skill in the art without creative effort, without departing from the purpose of the application, shall fall within the scope of protection of this application.

What is claimed is:

1. A HJT cell having high photoelectric conversion efficiency, comprising an N-type crystalline silicon wafer, wherein an intrinsic amorphous silicon layer, a $SiO_2$ layer, a C-doped $SiO_2$ layer, a doped N-type amorphous silicon layer, a TCO conductive layer and electrodes are sequentially disposed on a front surface of the N-type crystalline silicon wafer, and an intrinsic amorphous silicon layer, a $SiO_2$ layer, a C-doped $SiO_2$ layer, a doped P-type amorphous silicon layer, a TCO conductive layer and electrodes are sequentially disposed on a back surface of the N-type crystalline silicon wafer.

2. The HJT cell according to claim 1, wherein the intrinsic amorphous silicon layer includes a hydrogenated intrinsic amorphous silicon film layer.

3. The HJT cell according to claim 1, wherein a thickness of the intrinsic amorphous silicon layer ranges from 3 nm to 10 nm.

4. The HJT cell according to claim 1, wherein a thickness of the $SiO_2$ layer and a thickness of the C-doped $SiO_2$ layer each range from 1 nm to 5 nm.

5. The HJT cell according to claim 1, wherein a thickness of the doped P-type amorphous silicon layer ranges from 10 nm to 30 nm, the doped P-type amorphous silicon layer comprises a lightly B-doped amorphous silicon layer and a heavily B-doped amorphous silicon layer, the lightly B-doped amorphous silicon layer is located closer to the C-doped $SiO_2$ layer, and the heavily B-doped amorphous silicon layer is located closer to the TCO conductive layer.

6. The HJT cell according to claim 5, wherein the lightly B-doped amorphous silicon layer is formed by doping with TMB gas, a thickness of the lightly B-doped amorphous silicon layer ranges from 1 nm to 20 nm, and a forbidden band width of the lightly B-doped amorphous silicon layer ranges from 1.7 eV to 1.8 eV.

7. The HJT cell according to claim 6, wherein the heavily B-doped amorphous silicon layer is formed by doping with $B_2H_6$ gas, a thickness of the heavily B-doped amorphous silicon layer ranges from 1 nm to 20 nm, and a forbidden band width of the heavily B-doped amorphous silicon layer ranges from 1.4 eV to 1.6 eV.

8. The HJT cell according to claim 1, wherein a thickness of the doped N-type amorphous silicon layer ranges from 10 nm to 30 nm, the doped N-type amorphous silicon layer comprises a lightly P-doped amorphous silicon layer and a heavily P-doped amorphous silicon layer, the lightly P-doped amorphous silicon layer, is located closer to the C-doped $SiO_2$ layer, the heavily P-doped amorphous silicon layer is located closer to the TCO conductive layer, a thickness of the lightly P-doped amorphous silicon layer ranges from 1 nm to 20 nm, and a thickness of the heavily P-doped amorphous silicon layer ranges from 1 nm to 20 nm.

9. The HJT cell according to claim 7, wherein a thickness of the doped N-type amorphous silicon layer ranges from 10 nm to 30 nm, the doped N-type amorphous silicon layer comprises a lightly P-doped amorphous silicon layer and a heavily P-doped amorphous silicon layer, the lightly P-doped amorphous silicon layer is located closer to the C-doped $SiO_2$ layer, the heavily P-doped amorphous silicon layer is located closer to the TCO conductive layer, a thickness of the lightly P-doped amorphous silicon layer ranges from 1 nm to 20 nm, and a thickness of the heavily P-doped amorphous silicon layer ranges from 1 nm to 20 nm.

10. A method for preparing the HJT cell having high photoelectric conversion efficiency according to claim 1, comprising:

texturing and cleaning a N-type crystalline silicon wafer;

forming an intrinsic amorphous silicon layer or a hydrogenated intrinsic amorphous silicon film layer on both sides of the N-type crystalline silicon wafer by plasma enhanced chemical vapor deposition;

forming a $SiO_2$ layer and a C-doped $SiO_2$ layer by plasma enhanced chemical vapor deposition;

forming a doped N-type amorphous silicon layer and a doped P-type amorphous silicon layer by plasma enhanced chemical vapor deposition;

depositing a TCO conductive layer by deposition or sputtering by reactive ions; and forming front and back electrodes by screen printing.

11. The method according to claim 10, wherein the forming the doped N-type amorphous silicon layer and the doped P-type amorphous silicon layer by plasma enhanced chemical vapor deposition comprising:

growing, at a temperature of a silicon wafer substrate of 100° C.-300° C. and under a deposition pressure of 10 Pa-300 Pa, the doped N-type amorphous silicon layer and the doped P-type amorphous silicon layer respectively by using $H_2$, $SiH_4$, and doping gases TMB, $B_2H_6$ and $PH_3$ as reaction gases when a base vacuum of a vacuum chamber reaches $5 \times 10^{-4}$ Pa.

12. The method according to claim 11, wherein the depositing the TCO conductive layer by deposition or sputtering by reactive ions comprises:

depositing a transparent conductive ITO film on a front surface and a back surface respectively by magnetron sputtering, wherein the ITO film has a thickness of 70 nm to 110 nm, a transmittance of 98% or more, and a sheet resistance of 50Ω/□ to 100Ω/□.

13. The method according to claim 12, wherein the forming the front and back electrodes by screen printing comprises:

printing a layer of low-temperature conductive silver paste on the TCO conductive layers of the front and back surfaces by screen printing, respectively, and then sintering the layers of low-temperature conductive silver paste at a low temperature of 150° C. to 300° C. to form ohmic contact, wherein an Ag grid line has a thickness of 5 μm to 50 μm, a width of 20 μm to 60 μm, and a pitch of 1 mm to 5 mm.

14. The method according to claim 10, wherein the doped N-type amorphous silicon layer comprises a lightly P-doped amorphous silicon layer and a heavily P-doped amorphous silicon layer, and the doped P-type amorphous silicon layer comprises a lightly B-doped amorphous silicon layer and a heavily B-doped amorphous silicon layer.

15. The method according to claim 10, wherein the forming the doped N-type amorphous silicon layer and the doped P-type amorphous silicon layer by plasma enhanced chemical vapor deposition comprises:

growing, at a temperature of a silicon wafer substrate of 100° C. to 300° C. and under a deposition pressure of 10 Pa to 300 Pa, the doped N-type amorphous silicon layer and the doped P-type amorphous silicon layer on back surfaces of hydrogenated amorphous silicon oxycarbide films respectively, by using $H_2$, $SiH_4$, and doping gases TMB, $B_2H_6$ and $PH_3$ as reaction gases when a base vacuum of a vacuum chamber reaches $5\times10^{-4}$ Pa.

16. The method according to claim 14, wherein the lightly P-doped amorphous silicon layer is an N-type amorphous silicon layer lightly doped with P atoms; and the heavily P-doped amorphous silicon layer is an N-type amorphous silicon layer heavily doped with P atoms;

wherein the lightly B-doped amorphous silicon layer is a lightly B-doped P-type amorphous silicon layer formed by doping with TMB gas, and the heavily B-doped amorphous silicon layer is a heavily B-doped P-type amorphous silicon layer formed by doping with $B_2H_6$ gas.

17. The HJT cell according to claim 2, wherein a thickness of the hydrogenated intrinsic amorphous silicon film layer ranges from 3 nm to 10 nm.

* * * * *